US012791935B2

(12) United States Patent
Raschke

(10) Patent No.: US 12,791,935 B2
(45) Date of Patent: Nov. 10, 2026

(54) RETICLE SUPPORTS FOR REDUCING WEAR IN A RETICLE CONTAINER

(71) Applicant: ENTEGRIS, INC., Billerica, MA (US)

(72) Inventor: Russ V. Raschke, Chanhassen, MN (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 19/048,579

(22) Filed: Feb. 7, 2025

(65) Prior Publication Data

US 2025/0271750 A1 Aug. 28, 2025

Related U.S. Application Data

(60) Provisional application No. 63/556,843, filed on Feb. 22, 2024.

(51) Int. Cl.
*G03F 1/66* (2012.01)

(52) U.S. Cl.
CPC .................................... *G03F 1/66* (2013.01)

(58) Field of Classification Search
CPC .................................................... G03F 1/66
USPC .................................... 206/316.1, 454, 455
See application file for complete search history.

(56) References Cited

U.S. PATENT DOCUMENTS

| | | | | |
|---|---|---|---|---|
| 9,745,119 | B2 | 8/2017 | Kolbow | |
| 2006/0126052 | A1* | 6/2006 | Matsutori | G03F 7/70741 355/75 |
| 2006/0260978 | A1* | 11/2006 | Gregerson | H10P 72/1902 206/710 |
| 2022/0291596 | A1* | 9/2022 | Chiu | G03F 1/66 |
| 2024/0312816 | A1* | 9/2024 | Chiu | G03F 1/66 |
| 2025/0102901 | A1* | 3/2025 | Wang | G03F 1/38 |
| 2025/0258428 | A1* | 8/2025 | Tieben | G03F 7/70766 |
| 2026/0016761 | A1* | 1/2026 | Wang | G03F 7/70741 |

FOREIGN PATENT DOCUMENTS

| | | | | |
|---|---|---|---|---|
| JP | 2023130998 | A | 9/2023 | |
| KR | 20120119679 | A | 10/2012 | |
| KR | 20210006044 | A | 1/2021 | |
| TW | I634383 | B | 9/2018 | |
| TW | I823279 | B | 11/2023 | |
| WO | WO-2025064929 | A1 * | 3/2025 | G03F 1/66 |

* cited by examiner

*Primary Examiner* — Jacob K Ackun

(57) ABSTRACT

Reticle supports for use in a reticle container are provided for wear reduction. The reticle supports have a proximate end received in a baseplate. A reticle contact region at the distal end of the reticle support body contacts the reticle to suspend the reticle from the baseplate. The reticle support body allows a lateral movement of the distal end of the reticle support body along with the reticle with respect to the baseplate to prevent the reticle contact region of the reticle supports from sliding on and scratching the surface of reticle.

20 Claims, 6 Drawing Sheets

RETICLE SUPPORTS FOR REDUCING WEAR IN A RETICLE CONTAINER

FIELD

This disclosure is directed to reticle supports for use in reticle containers, and reticle containers such as reticle pods including such reticle supports.

BACKGROUND

Reticles, such as photolithography reticles, for example for extreme ultraviolet (EUV) photolithography, can be retained within reticle containers by way of contacts. Wear can occur at contact interfaces between supports and the reticle. When wear affects the contact interfaces, the reticle surface may be scratched (e.g., at least portions of a coating of the reticle can be damaged) and particulate material can be generated, which may further contaminate or damage the reticle.

SUMMARY

This disclosure is directed to reticle supports for use in reticle containers, and reticle containers such as reticle pods including such reticle contacts. By reducing wear at an interface between a reticle contained inside a reticle container and the reticle supports, the generation of particulate contamination and/or damage to a surface of the reticle can be suppressed.

In an embodiment, an apparatus includes a reticle pod. The reticle pod has a baseplate and one or more reticle supports. At least one of the reticle supports includes a reticle support body extending along a vertical direction from a proximate end to a distal end thereof, and a reticle contact region at the distal end of the reticle support body. The proximate end is received in the baseplate. The distal end of the reticle support body projects from the baseplate, and the reticle support body is configured to allow a movement of the distal end of the reticle support body with respect to the baseplate within a range from about 10 micrometers to about 100 micrometers along a direction in plane with the baseplate.

In an embodiment, a method of containing a reticle using a reticle pod is provided. The reticle pod includes a baseplate and a cover to accommodate the reticle. The method includes providing one or more reticle supports. At least one of the reticle supports includes a reticle support body extending along a vertical direction from a proximate end to a distal end thereof. The proximate end is received in the baseplate. The method further includes contacting a reticle contact region at the distal end of the reticle support body to a surface of the reticle to suspend the reticle from the baseplate when a pressure is applied. The distal end of the reticle support body projects from the baseplate, and the reticle support body is configured to allow a movement of the distal end of the reticle support body along with the reticle with respect to the baseplate within a range from about 10 micrometers to about 100 micrometers along a direction in plane with the baseplate, to prevent the reticle contact region of the reticle supports from sliding on and scratching the surface of reticle when the pressure is applied.

In an embodiment, the reticle support body is configured to allow a movement of the distal end of the reticle support body with respect to the baseplate within a range from about 20 micrometers to about 50 micrometers along the direction in plane with the baseplate, to prevent the reticle contact region of the reticle supports from sliding on and scratching the surface of reticle when the pressure is applied.

In an embodiment, the baseplate includes a hole to receive the proximal end of the reticle support body. In an embodiment, the proximal end of the reticle support body forms a pivot joint with a bottom surface of the hole. In an embodiment, a seal mechanism is provided at an opening of the hole to surround the distal end of the reticle support body.

In an embodiment, the reticle support body has a first dimension along a first direction in plane with the baseplate, and a second dimension along a second direction in plane with the baseplate, the first dimension being greater than the second dimension.

In an embodiment, the reticle support body includes a middle portion having a dimension along a direction in plane with the baseplate, the dimension of the middle portion is less than that of the distal end.

In an embodiment, the one or more reticle supports includes one or more relatively flexible pins having a first dimension along a direction in plane with the baseplate, and one or more relatively rigid pins having a second dimension along a direction in plane with the baseplate, the second dimension being greater than the first dimension.

DETAILED DESCRIPTION

This disclosure is directed to reticle contacts for use in reticle containers, and reticle containers such as reticle pods including such reticle contacts.

As used herein, "reticle contact region" is a region of a reticle contact configured to face a reticle when the reticle is placed in a reticle container including the reticle contact. As used herein, at least some of the reticle contact region may contact the reticle when the reticle container is closed with the reticle contained within.

As used herein, "generally perpendicular" means transverse, substantially transverse, or a relative angular orientation of 60° to 120°.

As used herein, "wear reduction feature" refers to a feature providing a reticle contact surface and/or provided in a reticle contact surface, the wear reduction feature configured to reduce the incidence of wear caused by contact between a reticle contact surface and a reticle. The wear reduction feature can be, for example, any of the embodiments provided herein.

Figure 1A:
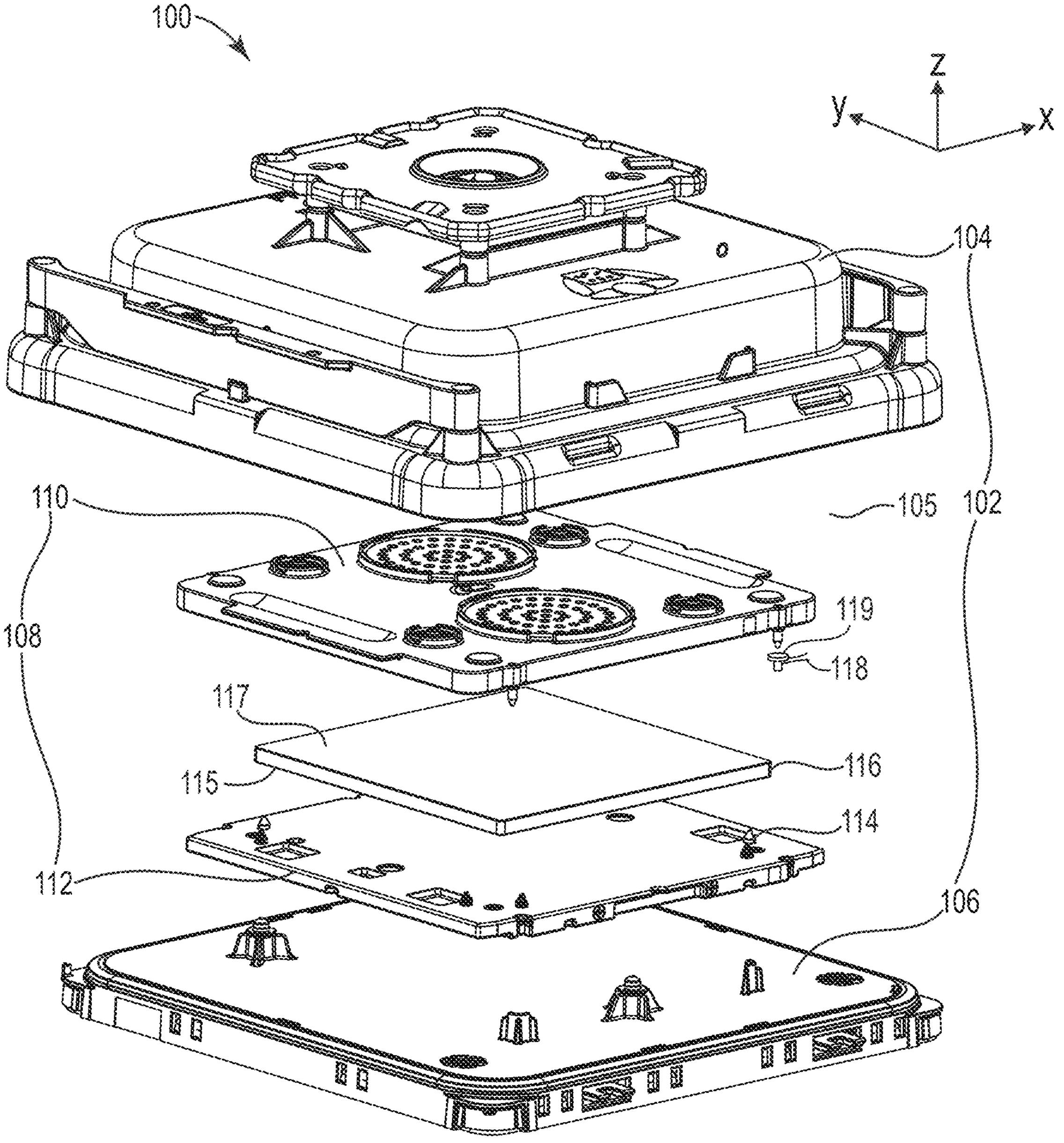
FIG. 1A shows a reticle container according to an embodiment.

FIG. 1A shows a reticle container or pod 100 according to an embodiment. The reticle pod 100 includes an outer pod 102 including a pod dome 104 and a pod door 106. The reticle pod 100 further includes an inner pod 108, which includes a cover 110 and a baseplate 112. One or more reticle supports 114 are provided in the baseplate 112. One or more reticle contacts 118 are provided in the cover 110.

At least some of reticle contacts 118 include a flexible mounting 119, such as a spring at the interface between the reticle contact 118 and the cover 110. In an embodiment, the reticle contacts 118 attached by the flexible mounting 119 can be provided on the cover 110. In an embodiment, the reticle contacts 118 attached by the flexible mounting 119 can include a spring attached to the reticle contact 118. The flexible mounting 119 can allow the associated reticle contact 118 to be vertically movable (e.g., along the z axis in the x-y-z Cartesian coordinate system in FIG. 1), for example as with the vertically movable reticle posts of U.S. Pat. No. 8,613,359, which is herein incorporated by reference in its entirety.

A reticle 116 can be contained within the reticle pod 100. When the reticle pod 100 is assembled and the reticle 116 is contained within the reticle pod 100, the reticle supports 114 and the reticle contacts 118 can contact to the opposite surfaces 115 and 117 of the reticle 116, respectively, to suspend the reticle 116 from the baseplate 112 and the cover 110.

The reticle pod 100 is configured to accommodate the reticle 116, for example for transportation or storage of the reticle 116. The reticle 116 can be any suitable reticle that can be contained within the reticle pod 100, such as a photolithography mask. In an embodiment, the reticle 116 is a reticle for extreme ultraviolet (EUV) photolithography. The reticle 116 includes the opposite surfaces 115 and 117 that are contacted by the reticle supports 114 and the reticle contacts 118, respectively, when the reticle 116 is contained within the inner pod 108 of the reticle pod 100.

The outer pod 102 forms an exterior of the reticle pod 100 when the reticle pod 100 is fully assembled. The outer pod 102 is configured to form an internal space 105 capable of accommodating or containing the inner pod 108. The outer pod 102 is formed of the pod dome 104 and the pod door 106. The pod dome 104 and the pod door 106 can be configured to be joined to one another, for example using a latching mechanism (not shown) or any other suitable mechanisms. The pod dome 104 and the pod door 106 can be configured such that the inner pod 108 is retained within the internal space 105 defined by the pod dome 104 and the pod door 106.

The inner pod 108 is a pod configured to accommodate or contain the reticle 116. The inner pod 108 includes the cover 110 and the baseplate 112. The inner pod 108 is configured such that it can fit within the internal space 105 of the outer pod 102. When the pod dome 104 and the pod door 106 are joined to receive the inner pod 108, a pressure (e.g., from a clamping force) may be applied against the inner pod 108.

The reticle supports 114 are each configured to be attached to the baseplate 112. The reticle supports 114 are configured to contact the reticle 116 so as to retain the position of the reticle 116 within the inner pod 108. According to some embodiments described herein, the reticle supports 114 are configured to absorb at least a portion of relative motion(s) between the reticle 116 and the baseplate 112 to reduce wear, e.g., by preventing the reticle supports 114 from sliding on and scratching the surface 115 of the reticle 116.

The relative motion(s) between the reticle 116 and the baseplate 112 may occur during the assembling, transportation, storage or other operations of the reticle 116 within the inner pod 118 and/or the reticle pod 100. For example, when the inner pod 118 is received in the outer pod 102, a pressure from a clamping force may be applied against the inner pod 118 to cause the baseplate 112 to deflect or deform. Such a deflection/deformation of the baseplate 112 may cause the relative motion(s) between the reticle 116 and the baseplate 112. A major portion of the relative motion(s) may be in plane with the baseplate 112 (e.g., within the x-y plane). It is to be understood that the reticle supports 14 are sufficiently rigid in the vertical direction (e.g., along the z axis) to retain the vertical position and/or height of the reticle 116 with respect to the baseplate 112. When the relative motion (s) between the reticle 116 and the baseplate 112 occur, a reticle contact/support surface in contact with a reticle surface may slide on or scratch the reticle surface and generate wear marks on the reticle surface.

In an embodiment, the reticle support 114 can extend from a proximate end to a distal end thereof and be configured to allow its distal end in contact with the reticle surface 115 to move along with the reticle 116 upon the relative motion(s) between the reticle 116 and the baseplate 112 to reduce wear. For example, the reticle support 114 can have its proximate end attached to the baseplate 112 and be configured to allow its distal end to move along with the reticle 116 in a direction substantially in plane with the baseplate 112, within a range, for example, at least 10 micrometers or more, at least 20 micrometers or more, from about 10 micrometers to about 100 micrometers, from about 20 micrometers to about 100 micrometers, or from about 20 micrometers to about 50 micrometers.

The reticle support 114 can be made of any suitable material based on cleanliness, compatibility, resilience, and the like. According to some embodiments described herein, suitable material(s) can be used such that a reticle support can satisfy at least some of the requirements described below.

The suitable material(s) of a reticle support can have certain material properties to minimize or reduce wear at an interface between a reticle contained inside a reticle container and the reticle support. The reticle support may have a configuration (e.g., material(s) and/or wear reduction feature(s)) at the distal end thereof to prevent the reticle support from sliding on and/or scratching the reticle surface. The distal end of the reticle support in contact with the reticle surface may have a coefficient of friction that is sufficiently high to prevent the sliding. In an embodiment, the coefficient of friction between the reticle support and the reticle surface can be in a range, for example, no less than 0.2, no less than 0.25, no less than 0.3, from about 0.2 to about 1.0, from about 0.25 to about 1.0, or from about 0.3 to 1.0.

The suitable material(s) of a reticle support can have certain material properties to maintain the position and height of the reticle with respect to the baseplate. In an embodiment, with the reticle being contained within the reticle pod and in contact with the reticle supports, at least one of the reticle supports can maintain its height (i.e., a length along the z axis) with an absolute change no greater than 0.015 mm, no greater than 0.01 mm, or no greater than 0.005 mm, or with a relative change no greater than 10%, no greater than 8%, no greater than 5%, no greater than 3%, or no greater than 1%.

The suitable material(s) of a reticle support can have certain stiffness and resistance to deflection. In an embodiment, at least one of the reticle supports can have a Young's modulus in a range, for example, from about 3.0 GPa to about 4.5 GPa, from about 3.5 GPa to about 4.5 GPa, or about 3.6 GPa to about 4.0 GPa.

The suitable material(s) of a reticle support can have certain resistance to breaking/fracturing/deforming under tension to prevent material failure and/or generation of particle or particulate contamination. In an embodiment, at least one of the reticle supports can have a tensile strength in a range, for example, from about 70 MPa to about 100 MPa, from about 80 MPa to about 100 MPa, or from about 90 MPa to about 100 MPa.

A non-limiting example of a suitable material for a reticle support described herein is a polyether ether ketone (PEEK) material. Other suitable material(s) may include, but not be limited to, polyethylenimine (PEI) or polyaziridine, and polyamide-imide which may be commercially available from Solvay Specialty Polymers (Brussels, Belgium) under the tradename Torlon.

Figure 1B:
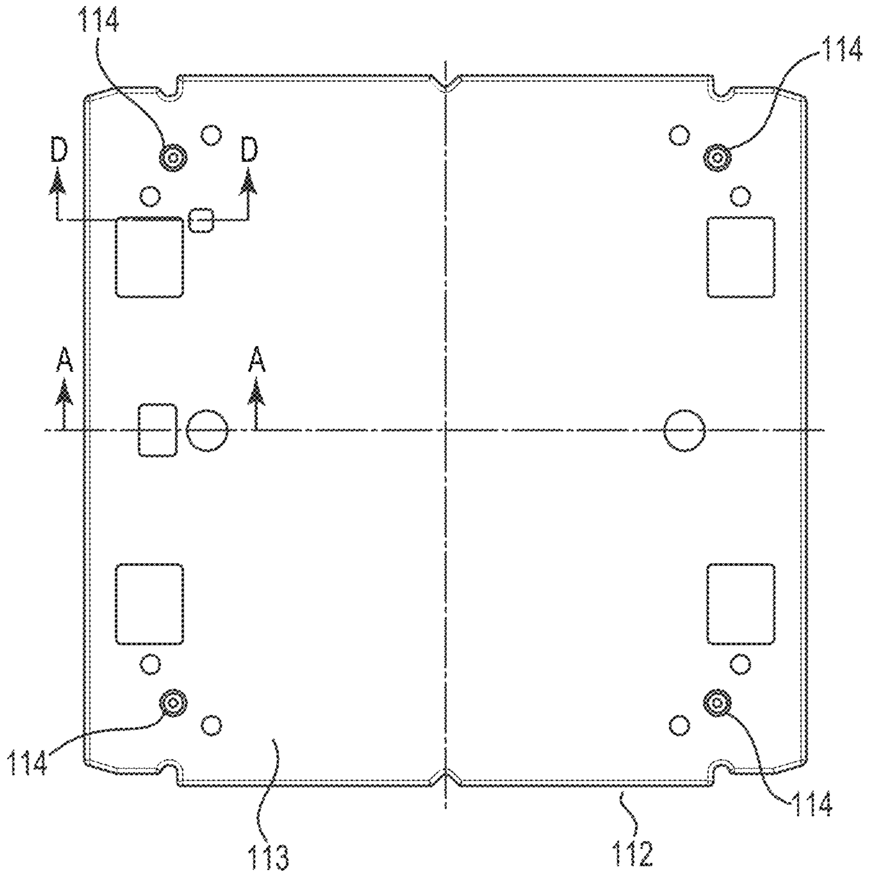
FIG. 1B is a top view of a baseplate in the reticle container of FIG. 1A.

FIG. 1B is a top view of the baseplate 112 of the reticle pod 100 in FIG. 1A. FIG. 1B shows the top surface 113 of the baseplate 112 having a generally rectangular shape. The cover 110 in FIG. 1A is configured to be placed onto the top surface 113 of the baseplate 112. The baseplate 112 includes multiple reticle supports 114 attached to the top surface 113 thereof. The baseplate 112 may include a sealing surface (not shown) formed on the top surface 113 and extending along the entire perimeter of the baseplate 112 to reduce wear between the baseplate 112 and the cover 110 when the reticle pod 100 is closed. Exemplary sealing surfaces are described in U.S. patent application Ser. No. 17/973,170, which is herein incorporated by reference in its entirety. In the embodiment depicted in FIG. 1B, four reticle supports 114 are provided adjacent to the four corners of the baseplate 112. It is to be understood that the embodiments described and recited herein are not limited to the quantity described. That is, the quantity described and recited herein are provided for descriptive purposes only and are not intended to be limiting. Examples of the reticle supports 114 are shown in further detail in FIGS. 2-5, and are described below.

Figure 2:
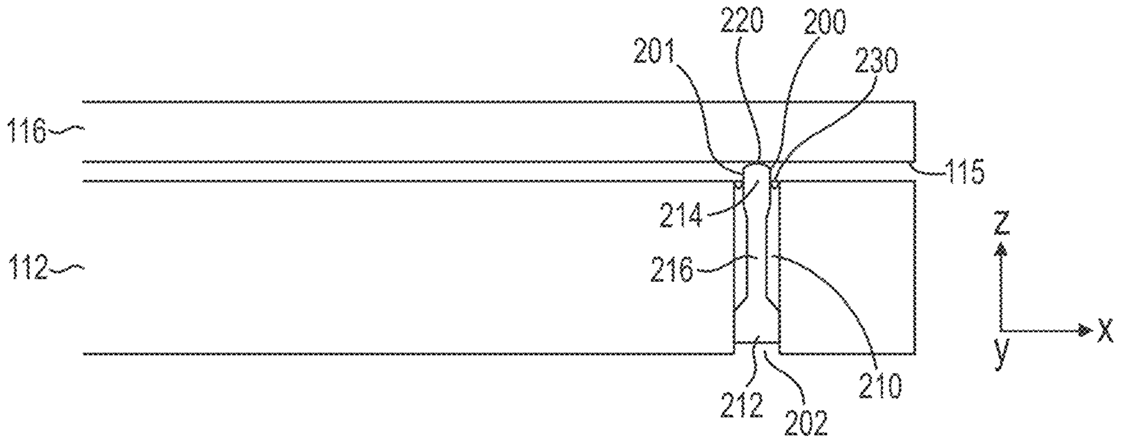
FIG. 2 shows a sectional view of a reticle support received in a baseplate of a reticle pod, according to an embodiment.

FIG. 2 shows a sectional view of a reticle support 200 according to an embodiment. The reticle support 200 includes a reticle support body 210 extending along a vertical direction (e.g., along the ±z axis) from a proximate end 212 to a distal end 214 thereof. The proximate end 212 is configured to be received in a hole 202 of the baseplate 112. In the depicted embodiment, the hole 202 is a through hole to receive the reticle support body 210. It is to be understood that the hole 202 can be a recess, a channel, a depression, an opening, or the like. The proximate end 212 can be attached to a bottom portion of the hole 202 such that the reticle support 200 is retained to the baseplate 112.

The reticle support 200 further includes a reticle contact region 220 at the distal end 214 of the reticle support body 210. The distal end 214 of the reticle support body 210 projects from the baseplate 112. The reticle contact region 220 at the distal end 214 of the reticle support body 210 contacts to the surface 115 of the reticle 116 to suspend the reticle 116 from the baseplate 116 when the reticle 116 is contained within a reticle pod and a pressure (e.g., from a clamping force) is applied to the reticle 116 against the reticle support 200. Upon the pressure applied, the reticle support 200 can maintain its height (i.e., a length along the z axis) within a predetermined range such that the vertical position and/or height of the reticle 116 with respect to the baseplate 112 can be maintained. That is, the reticle support body 210 can be configured such that the reticle contact region 220 is provided at a desired position, such as a desired height, a desired position relative to the reticle 116, or the like.

The reticle support body 210 is configured to allow a lateral movement of the distal end 214 of the reticle support body 210 along with the reticle 116 with respect to the baseplate 112 to prevent the reticle contact region 220 of the reticle support 200 from sliding on and/or scratching the surface 115 of the reticle 116. When a relative motion between the reticle 116 and the baseplate 112 occurs, the distal end 214 of the reticle support body 210 may move along with the reticle 116 along a direction substantially in plane with the baseplate 112 (e.g., substantially within the x-y plane) within a range, for example, from about 10 micrometers to about 100 micrometers.

In the embodiment depicted in FIG. 2, the reticle support body 210 includes a middle portion 216 having a lateral dimension along a direction in plane with the baseplate 112. The dimension of the middle portion 216 is less than that of the distal end 214. In other words, the reticle support body 210 includes a relatively thinner middle portion 216, which allows the reticle support body 210 to flex laterally (e.g., being laterally compliant with the reticle 116 in the x-y plane) within a predetermined range and still remain its rigidity vertically (e.g., along the z axis). In an embodiment, the thinner middle portion 216 may have a diameter, for example, about 20% to about 80% of a diameter of the distal end 214. In an embodiment, the thinner middle portion 216 may have a length, for example, about 20% to about 80% of the total length of the reticle support body 210.

A seal mechanism 230 is provided at an opening 201 of the hole 202 to surround the distal end 214 of the reticle support body 210. The seal mechanism 230 is flexible and/or compressible to allow the lateral movement of the distal end 214 of the reticle support body 210 with respect to the baseplate 112. The seal mechanism 230 can be made of any suitable material based on cleanliness, compatibility, resilience, and the like. A non-limiting example of the seal mechanism 230 is an O-ring. The seal mechanism 230 can prevent particles or particulate material from falling into the hole 202. The seal mechanism 230 may have a suitable flexibility and/or compressibility to allow the lateral movement of the distal end 214 along with the reticle 116, and confine such a lateral movement within a range, for example, from about 10 micrometers to about 100 micrometers.

The reticle contact region 220 is a portion of the reticle contact 200 configured to face the reticle surface 115 when the reticle support 200 is installed in the baseplate 112 and the reticle 116 is contained within a reticle container. At least some of the reticle contact region 220 may contact the reticle surface 115 when the reticle container is closed with the reticle contained within. Wear reducing features (not shown) can be provided on the reticle contact region 220 for wear reduction. The wear reduction features may include one or more of a ring-shaped projection or one or more elongate arcing projections from a reticle contact region, one or more reliefs such as ring-shaped trenches provided in a reticle contact region, or one or more reliefs provided by having relatively thinner regions of the reticle contact region. Exemplary wear reduction features are described in U.S. Provisional Patent Application No. 63/539,978, which is herein incorporated by reference in its entirety.

Figure 3:
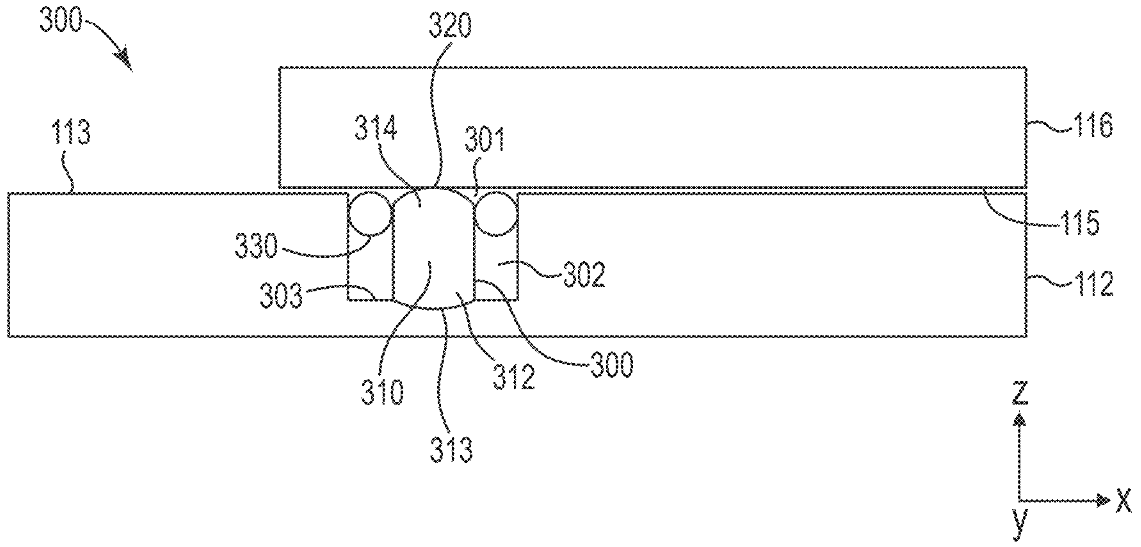
FIG. 3 shows a sectional view of a reticle support received in a baseplate of a reticle pod, according to an embodiment.

FIG. 3 shows a sectional view of a reticle support 300 according to an embodiment. The reticle support 300 includes a reticle support body 310 extending along a vertical direction (e.g., along the ±z axis) from a proximate end 312 to a distal end 314 thereof. The proximate end 312 is configured to be received in a hole 302 of the baseplate 112. In the depicted embodiment, the hole 302 is formed into the surface 113 of the baseplate 112 to receive the reticle support body 310. It is to be understood that the hole 302 can be a recess, a channel, a depression, an opening, or the like. The proximate end 312 of the reticle support 300 is attached to a bottom surface 303 of the hole 302 such that the reticle support 200 is retained to the baseplate 112.

The reticle support 300 further includes a reticle contact region 320 at the distal end 314 of the reticle support body 310. The distal end 314 of the reticle support body 310 projects from the baseplate 112. The reticle contact region 320 at the distal end 314 of the reticle support body 210 contacts to the surface 115 of the reticle 116 to suspend the reticle 116 from the baseplate 116 when the reticle 116 is contained within a reticle pod and a pressure is applied to the reticle 116 against the reticle support 200. Upon the pressure applied, the reticle support 300 can maintain its height within a predetermined range such that the vertical position and/or height of the reticle 116 with respect to the baseplate 112 can be maintained. That is, the reticle support body 310 can be configured such that the reticle contact region 320 is provided at a desired position, such as a desired height, a desired position relative to the reticle 116, or the like.

The reticle support body 310 is configured to allow a lateral movement of the distal end 314 of the reticle support body 310 with respect to the baseplate 112 to prevent the reticle contact region 320 of the reticle support 300 from sliding on and/or scratching the surface 115 of the reticle 116. When a relative motion between the reticle 116 and the baseplate 112 occurs, the distal end 314 of the reticle support body 310 may move along with the reticle 116 along a direction substantially in plane with the baseplate 112 (e.g., substantially within the x-y plane) within a range, for example, from about 10 micrometers to about 100 micrometers.

In the embodiment depicted in FIG. 3, the proximate end 312 of the reticle support body 310 forms a pivot joint 313 with the bottom surface 303 of the hole 302 to allow a controlled rotational movement of the reticle support body 310 with respect to the baseplate 112. Such a controlled rotational movement allows the distal end 314 of the reticle support body 310 to move along with the reticle 116 along a direction substantially in plane with the baseplate 112. In other words, the pivot joint 313 allows the reticle support body 310 to flex laterally (e.g., being laterally compliant with the reticle 116 in the x-y plane) within a predetermined range and still remain its rigidity vertically (e.g., along the z axis). In the depicted embodiment, the pivot joint 313 is formed by engaging a convex surface at the proximate end 312 of the reticle support body 310 and a concave surface on the bottom surface 303 of the hole 302. It is to be understood that the pivot joint 313 can be formed by any suitable mechanisms such as, for example, a bearing, a bushing, or a hole structure on the bottom surface 303 to engage with the proximate end 312 of the reticle support body 310.

A seal mechanism 330 is provided at an opening 301 of the hole 302 to surround the distal end 314 of the reticle support body 310. The seal mechanism 330 is flexible to allow the lateral movement of the distal end 314 of the reticle support body 310 with respect to the baseplate 112. The seal mechanism 330 can be made of any suitable material based on cleanliness, compatibility, resilience, and the like. A non-limiting example of the seal mechanism is an O-ring. The seal mechanism 330 can prevent particles or particulate material from falling into the hole 302. The seal mechanism 330 may have a suitable flexibility and/or compressibility to allow the rotation of the reticle support body 310 around the pivot joint 313 and the lateral movement of the distal end 314 along with the reticle 116, and confine such a lateral movement within a range, for example, from about 10 micrometers to about 100 micrometers.

The reticle contact region 320 is a portion of the reticle contact 300 configured to face the reticle surface 115 when the reticle support 300 is installed in the baseplate 112 and the reticle 116 is contained within a reticle container. At least some of the reticle contact region 320 may contact the reticle surface 115 when the reticle container is closed with the reticle contained within. Wear reducing features (not shown) can be provided on the reticle contact region 320 for wear reduction.

Figure 4:
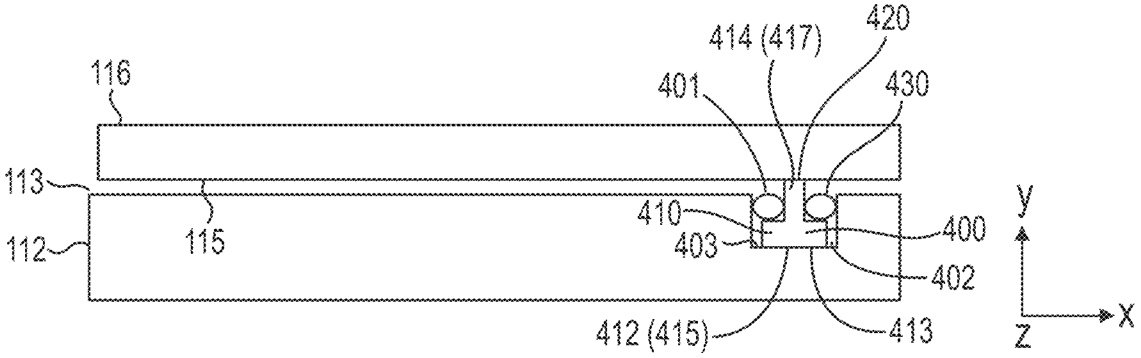
FIG. 4 shows a sectional view of a reticle support received in a baseplate of a reticle pod, according to an embodiment.

FIG. 4 shows a sectional view of a reticle support 400 according to an embodiment. The reticle support 400 includes a reticle support body 410 extending along a vertical direction (e.g., along the ±z axis) from a proximate end 412 to a distal end 414 thereof. The reticle support body 410 includes a base 415 at the proximate end 412 which is configured to be received in a hole 402 of the baseplate 112. The reticle support body 410 further includes a pin 417 at the distal end 414, which projects from an opening 401 of the hole 402. The pin 417 connects to the base 415 of the reticle support body 410, together forming a cross-sectional inverted “T” shape. In the depicted embodiment, the hole 402 is formed into the surface 113 of the baseplate 112 to receive the reticle support body 410. The base 415 at the proximate end 412 of the reticle support 400 is attached to a bottom surface 403 of the hole 402 such that the reticle support 200 is retained to the baseplate 112.

The reticle support 400 further includes a reticle contact region 420 at the distal end 414 of the reticle support body 410. The distal end 414 of the reticle support body 410 projects from the baseplate 112. The reticle contact region 420 at the distal end 414 of the reticle support body 210 contacts to the surface 115 of the reticle 116 to suspend the reticle 116 from the baseplate 116 when the reticle 116 is contained within a reticle pod and a pressure is applied to the reticle 116 against the reticle support 200. Upon the pressure applied, the reticle support 400 can maintain its height within a predetermined range such that the position and height of the reticle 116 with respect to the baseplate 112 can be maintained. That is, the reticle support body 410 can be configured such that the reticle contact region 420 is provided at a desired position, such as a desired height, a desired position relative to the reticle 116, or the like.

The reticle support body 410 is configured to allow a lateral movement of the distal end 414 of the reticle support body 410 with respect to the baseplate 112 to prevent the reticle contact region 420 of the reticle support 400 from sliding on and/or scratching the surface 115 of the reticle 116. When a relative motion between the reticle 116 and the baseplate 112 occurs, the distal end 414 of the reticle support body 410 may move along with the reticle 116 along a direction substantially in plane with the baseplate 112 (e.g., substantially within the x-y plane) within a range, for example, from about 10 micrometers to about 100 micrometers.

In the embodiment depicted in FIG. 4, the base 415 at the proximate end 412 of the reticle support body 410 includes a sliding surface 413 to engage with the bottom surface 403 of the hole 402 to allow a controlled sliding movement of the reticle support body 410 with respect to the baseplate 112. Such a controlled sliding movement allows the distal end 414 of the reticle support body 410 to move along with the reticle 116 along a direction substantially in plane with the baseplate 112. In other words, the sliding engagement allows the reticle support body 410 to flex laterally (e.g., being laterally compliant with the reticle 116 in the x-y plane) within a predetermined range and still remain its rigidity vertically (e.g., along the z axis). In an embodiment, a film or coating may be provided at the interface between the sliding surface 413 and the bottom surface 403 of the hole 402 to facilitate the sliding movement. It is to be understood that the sliding engagement can be facilitated by any suitable mechanisms such as, for example, a track or guide, a slide or rail, or other sliding components.

A seal mechanism 430 is provided at an opening 401 of the hole 402 to surround the pin 417 at the distal end 414 of the reticle support body 410. The seal mechanism 430 is flexible to allow the sliding movement of the reticle support body 410 with respect to the baseplate 112. The seal mechanism 430 can be made of any suitable material based on cleanliness, compatibility, resilience, and the like. A non-limiting example of the seal mechanism is an O-ring. The seal mechanism 430 can prevent particles or particulate material from falling into the hole 402. The seal mechanism 430 may have a suitable flexibility and/or compressibility to allow the lateral movement of the distal end 414 along with the reticle 116, and confine such a lateral movement within a range, for example, from about 10 micrometers to about 100 micrometers.

The reticle contact region 420 is a portion of the reticle contact 400 configured to face the reticle surface 115 when the reticle support 400 is installed in the baseplate 112 and the reticle 116 is contained within a reticle container. At least some of the reticle contact region 420 may contact the reticle surface 115 when the reticle container is closed with the reticle contained within. Wear reducing features (not shown) can be provided on the reticle contact region 420 for wear reduction.

Figure 5:
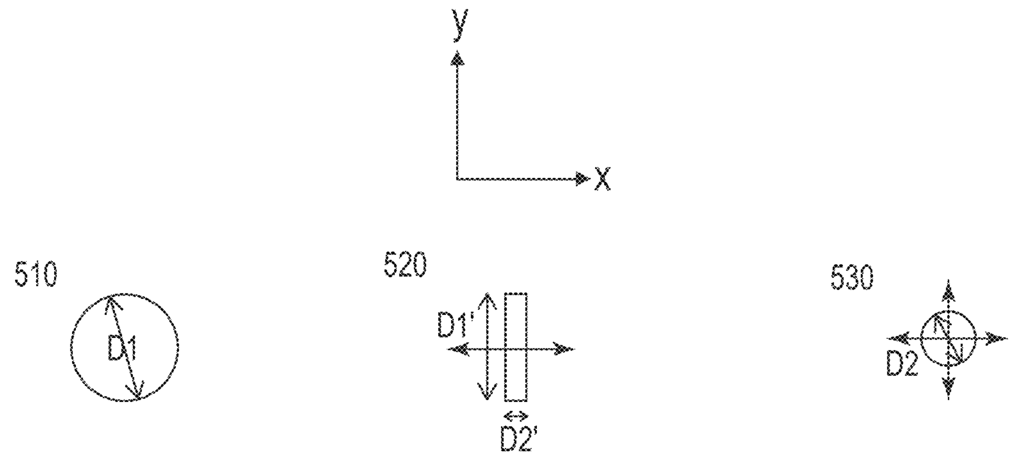
FIG. 5 shows a top view of the reticle supports of FIGS. 2-4, according to some embodiments.

FIG. 5 shows a top view of the reticle supports of FIGS. 1A-4, according to some embodiments. A reticle support described herein such as the reticle support 114 of FIGS. 1A-B, the reticle support 200 of FIG. 2, the reticle support 300 of FIG. 3, and the reticle support 400 of FIG. 4 may include one or more of reticle support bodies (e.g., pins) 510, 520, or 530 as illustrated in FIG. 5. The reticle support body 510 has a first lateral dimension D1 along a direction in plane with a baseplate (e.g., in the x-y plane). The reticle support body 530 has a second lateral dimension D2 along a direction in plane with a baseplate (e.g., in the x-y plane). The first lateral dimension D1 is greater than the second lateral dimension D2 such that the reticle support body 510 is relatively more rigid along lateral directions in plane with the baseplate than the reticle support body 530. In other words, the reticle support body 510 can be laterally rigid along directions in plane with the baseplate, and the reticle support body 530 is laterally flexible along directions in plane with the baseplate. The reticle support body 520 has a first lateral dimension D1' along a first direction in plane with the baseplate (e.g., along the y axis), and a second lateral dimension D2' along a second direction in plane with the baseplate (e.g., along the x axis). The first lateral dimension D1' is greater (e.g., at least one time, 1.5 times, 2 times, 3 times, 4 times or more) than the second lateral dimension D2' such that the reticle support body 520 is relatively more rigid along the second direction (e.g., along the x axis) than along the first direction (e.g., along the y axis).

ASPECTS

Aspect 1. An apparatus comprising a reticle pod, the reticle pod having:

a baseplate; and one or more reticle supports, at least one of the reticle supports including:

a reticle support body extending along a vertical direction from a proximate end to a distal end thereof, the proximate end being configured to be received in the baseplate; and a reticle contact region at the distal end of the reticle support body, wherein the distal end of the reticle support body projects from the baseplate, and the reticle support body is configured to allow a movement of the distal end of the reticle support body with respect to the baseplate within a range from about 10 micrometers to about 100 micrometers along a direction in plane with the baseplate.

Aspect 2. The apparatus of Aspect 1, wherein the range is from about 20 micrometers to about 50 micrometers.

Aspect 3. The apparatus of Aspect 1, wherein the baseplate includes a hole to receive the proximal end of the reticle support body.

Aspect 4. The apparatus of Aspect 3, wherein the proximal end of the reticle support body forms a pivot joint with a bottom surface of the hole.

Aspect 5. The apparatus of Aspect 3, further comprising a seal mechanism at an opening of the hole to surround the distal end of the reticle support body.

Aspect 6. The apparatus of Aspect 5, wherein the seal mechanism is flexible to allow the movement of the distal end of the reticle support body with respect to the baseplate.

Aspect 7. The apparatus of Aspect 1, wherein the reticle support body has a first dimension along a first direction in plane with the baseplate, and a second dimension along a second direction in plane with the baseplate, the first dimension being greater than the second dimension.

Aspect 8. The apparatus of Aspect 1, wherein the reticle support body includes a middle portion having a dimension along a direction in plane with the baseplate, the dimension of the middle portion is less than that of the distal end.

Aspect 9. The apparatus of Aspect 1, wherein the one or more reticle supports comprises one or more relatively flexible pins having a first dimension along a direction in plane with the baseplate, and one or more relatively rigid pins having a second dimension along a direction in plane with the baseplate, the second dimension being greater than the first dimension.

Aspect 10. The apparatus of Aspect 1, wherein the reticle support body comprises one or more polymer materials.

Aspect 11. The apparatus of Aspect 1, wherein the reticle contact region further comprises a wear reduction feature.

Aspect 12. The apparatus of Aspect 1, wherein the reticle pod further comprises a cover attachable to the baseplate to accommodate a reticle.

Aspect 13. The apparatus of Aspect 12, wherein the cover further comprises:

one or more reticle contacts to contact the reticle from a side of the cover; and a flexible mounting to allow the one or more reticle contacts to move relative to the cover along the vertical direction when the flexible mounting is deformed.

Aspect 14. The apparatus of Aspect 12, further comprising an outer pod dome and an outer pod door, the outer pod dome and the outer pod door configured to accommodate the baseplate and the cover within the outer pod dome when the outer pod door is attached to the outer pod dome.

Aspect 15. A method of containing a reticle using a reticle pod, the reticle pod including a baseplate and a cover to accommodate the reticle, the method comprising:

providing one or more reticle supports, at least one of the reticle supports including a reticle support body extending along a vertical direction from a proximate end to a distal end thereof, the proximate end being configured to be received in the baseplate; and contacting a reticle contact region at the distal end of the reticle support body to a surface of the reticle to suspend the reticle from the baseplate when a pressure is applied, wherein the distal end of the reticle support body projects from the baseplate, and the reticle support body is configured to allow a movement of the distal end of the reticle support body with respect to the baseplate within a range from about 10 micrometers to about 100 micrometers along a direction in plane with the baseplate, to prevent the reticle contact region of the reticle supports from sliding on and scratching the surface of reticle when the pressure is applied.

Aspect 16. The method of Aspect 15, wherein the range is from about 20 micrometers to about 50 micrometers.

Aspect 17. The method of Aspect 15, wherein the baseplate includes a hole to receive the proximal end of the reticle support body.

Aspect 18. The method of Aspect 17, wherein the proximal end of the reticle support body forms a pivot joint with a bottom surface of the hole.

Aspect 19. The method of Aspect 17, further comprising providing a seal mechanism at an opening of the hole to surround the distal end of the reticle support body.

Aspect 20. The method of Aspect 15, wherein the reticle support body has a first dimension along a first direction in plane with the baseplate, and a second dimension along a second direction in plane with the baseplate, the first dimension being greater than the second dimension.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. An apparatus comprising a reticle pod, the reticle pod having:

a baseplate; and one or more reticle supports, at least one of the reticle supports including:

a reticle support body extending along a vertical direction from a proximate end to a distal end thereof, the proximate end being configured to be received in the baseplate; and a reticle contact region at the distal end of the reticle support body, wherein the distal end of the reticle support body projects from the baseplate, and the reticle support body is configured to allow a movement of the distal end of the reticle support body with respect to the baseplate within a range from about 5 micrometers to about 100 micrometers along a direction in plane with the baseplate.

2. The apparatus of claim 1, wherein the range is from about 20 micrometers to about 50 micrometers.

3. The apparatus of claim 1, wherein the baseplate includes a hole to receive the proximal end of the reticle support body.

4. The apparatus of claim 3, wherein the proximal end of the reticle support body forms a pivot joint with a bottom surface of the hole.

5. The apparatus of claim 3, further comprising a seal mechanism at an opening of the hole to surround the distal end of the reticle support body.

6. The apparatus of claim 5, wherein the seal mechanism is flexible to allow the movement of the distal end of the reticle support body with respect to the baseplate.

7. The apparatus of claim 1, wherein the reticle support body has a first dimension along a first direction in plane with the baseplate, and a second dimension along a second direction in plane with the baseplate, the first dimension being greater than the second dimension.

8. The apparatus of claim 1, wherein the reticle support body includes a middle portion having a dimension along a direction in plane with the baseplate, the dimension of the middle portion is less than that of the distal end.

9. The apparatus of claim 1, wherein the one or more reticle supports comprises one or more relatively flexible pins having a first dimension along a direction in plane with the baseplate, and one or more relatively rigid pins having a second dimension along a direction in plane with the baseplate, the second dimension being greater than the first dimension.

10. The apparatus of claim 1, wherein the reticle support body comprises one or more polymer materials.

11. The apparatus of claim 1, wherein the reticle contact region further comprises a wear reduction feature.

12. The apparatus of claim 1, wherein the reticle pod further comprises a cover attachable to the baseplate to accommodate a reticle.

13. The apparatus of claim 12, wherein the cover further comprises:

one or more reticle contacts to contact the reticle from a side of the cover; and a flexible mounting to allow the one or more reticle contacts to move relative to the cover along the vertical direction when the flexible mounting is deformed.

14. The apparatus of claim 12, further comprising an outer pod dome and an outer pod door, the outer pod dome and the outer pod door configured to accommodate the baseplate and the cover within the outer pod dome when the outer pod door is attached to the outer pod dome.

15. A method of containing a reticle using a reticle pod, the reticle pod including a baseplate and a cover to accommodate the reticle, the method comprising:

providing one or more reticle supports, at least one of the reticle supports including a reticle support body extending along a vertical direction from a proximate end to a distal end thereof, the proximate end being configured to be received in the baseplate; and contacting a reticle contact region at the distal end of the reticle support body to a surface of the reticle to suspend the reticle from the baseplate when a pressure is applied, wherein the distal end of the reticle support body projects from the baseplate, and the reticle support body is configured to allow a movement of the distal end of the reticle support body along with the reticle with respect to the baseplate within a range from about 5 micrometers to about 100 micrometers along a direction in plane with the baseplate, to prevent the reticle contact region of the reticle supports from sliding on and scratching the surface of reticle when the pressure is applied.

16. The method of claim 15, wherein the range is from about 20 micrometers to about 50 micrometers.

17. The method of claim 15, wherein the baseplate includes a hole to receive the proximal end of the reticle support body.

18. The method of claim 17, wherein the proximal end of the reticle support body forms a pivot joint with a bottom surface of the hole.

19. The method of claim 17, further comprising providing a seal mechanism at an opening of the hole to surround the distal end of the reticle support body.

20. The method of claim 15, wherein the reticle support body has a first dimension along a first direction in plane with the baseplate, and a second dimension along a second direction in plane with the baseplate, the first dimension being greater than the second dimension.

* * * * *